United States Patent
Xie et al.

(10) Patent No.: US 10,304,520 B1
(45) Date of Patent: May 28, 2019

(54) HIGH SIGNAL VOLTAGE TOLERANCE IN SINGLE-ENDED MEMORY INTERFACE

(71) Applicant: Integrated Device Technology, Inc., San Jose, CA (US)

(72) Inventors: Yi Xie, Shanghai (CN); Yue Yu, Johns Creek, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/886,955

(22) Filed: Feb. 2, 2018

(30) Foreign Application Priority Data

Jan. 19, 2018 (CN) .......................... 2018 1 0051042

(51) Int. Cl.
  *G11C 5/14* (2006.01)
  *G11C 11/4093* (2006.01)
  *G11C 11/4074* (2006.01)

(52) U.S. Cl.
  CPC ...... *G11C 11/4093* (2013.01); *G11C 11/4074* (2013.01)

(58) Field of Classification Search
  CPC .................. G11C 11/4093; G11C 11/4074
  See application file for complete search history.

(56) References Cited

U.S. PATENT DOCUMENTS

| | | | | |
|---|---|---|---|---|
| 4,812,689 A | * | 3/1989 | Whiteley | ................. H03K 3/38 257/31 |
| 8,930,647 B1 | * | 1/2015 | Smith | ................. G06F 9/44557 711/154 |
| 2018/0217960 A1 | * | 8/2018 | Kuehlwein | ......... G06F 13/4286 |

* cited by examiner

*Primary Examiner* — Gene N Auduong
(74) *Attorney, Agent, or Firm* — Christopher P. Maiorana, PC

(57) ABSTRACT

An apparatus includes a line-termination circuit and a continuous-time linear equalizer circuit. The line-termination circuit may be configured to generate a data signal in response to an input signal. The input signal generally resides in a first voltage domain. The input signal may be single-ended. The data signal may be generated in the first voltage domain. The continuous-time linear equalizer circuit may be configured to generate an intermediate signal by equalizing the data signal relative to a reference voltage. The continuous-time linear equalizer circuit generally operates in a second voltage domain. The first voltage domain may be higher than the second voltage domain.

20 Claims, 6 Drawing Sheets

HIGH SIGNAL VOLTAGE TOLERANCE IN SINGLE-ENDED MEMORY INTERFACE

This application relates to Chinese Application No. 201810051042.6, filed Jan. 19, 2018, which is hereby incorporated by reference in its entirety.

FIELD OF THE INVENTION

The invention relates to signal receivers generally and, more particularly, to a method and/or apparatus for implementing high signal voltage tolerance in a single-ended memory interface.

BACKGROUND

Conventional double data rate fourth generation (DDR4) interfaces are specified to operate at a data rate up to 3.2 gigabits/second. At such high data rates, signal integrity becomes an issue. A continuous-time linear equalizer (CTLE) circuit is widely used to compensate for channel insertion loss and return loss. A slicer circuit differentiates the compensated signal. Under various power supply conditions, a CTLE output common mode voltage can become too high for the slicer circuit to properly differentiate. Tests show receiver malfunctions at high power supply voltages. Under large input voltage swing conditions, receiver setup times result in poor timing margins and poor data eye-diagram symmetry.

It would be desirable to implement high signal voltage tolerance in a single-ended memory interface.

SUMMARY

The invention concerns an apparatus including a line-termination circuit and a continuous-time linear equalizer circuit. The line-termination circuit may be configured to generate a data signal in response to an input signal. The input signal generally resides in a first voltage domain. The input signal may be single-ended. The data signal may be generated in the first voltage domain. The continuous-time linear equalizer circuit may be configured to generate an intermediate signal by equalizing the data signal relative to a reference voltage. The continuous-time linear equalizer circuit generally operates in a second voltage domain. The first voltage domain may be higher than the second voltage domain.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing high signal voltage tolerance in a single-ended memory interface that may (i) operate with high power supply voltages, (ii) tolerate high signal voltage swings, (iii) sequentially reduce an input voltage swing through multiple voltage domains, (iv) provide low latency, (v) provide balanced rise time delays and fall time delays and/or (vi) be implemented as one or more integrated circuits.

In various embodiments of the invention, a continuous-time linear equalizer (CTLE) circuit operating in an intermediate voltage domain, may compensate for channel loss and reflections in multi-drop applications, such as memory interface circuitry. Output signals and input signals generated and received by the memory interface circuitry generally reside in a high voltage domain. A data sampling slicer circuit, operating in a low voltage domain, may differentiate the compensated input signal created by the CTLE circuit. Compared to existing designs, the CTLE circuit and the slicer circuit may tolerate higher power supply voltage applications than normal and/or tolerate higher input signal voltage swings than normal. Furthermore, the CTLE circuit and the slicer circuit may be implemented with fast core transistors (or devices). As a result, the CTLE circuit generally has a lower latency with more balanced rise/fall delays than common designs. The lower latency and balanced delays may improve both timing margins and symmetry of data eye-diagrams.

Figure 1:
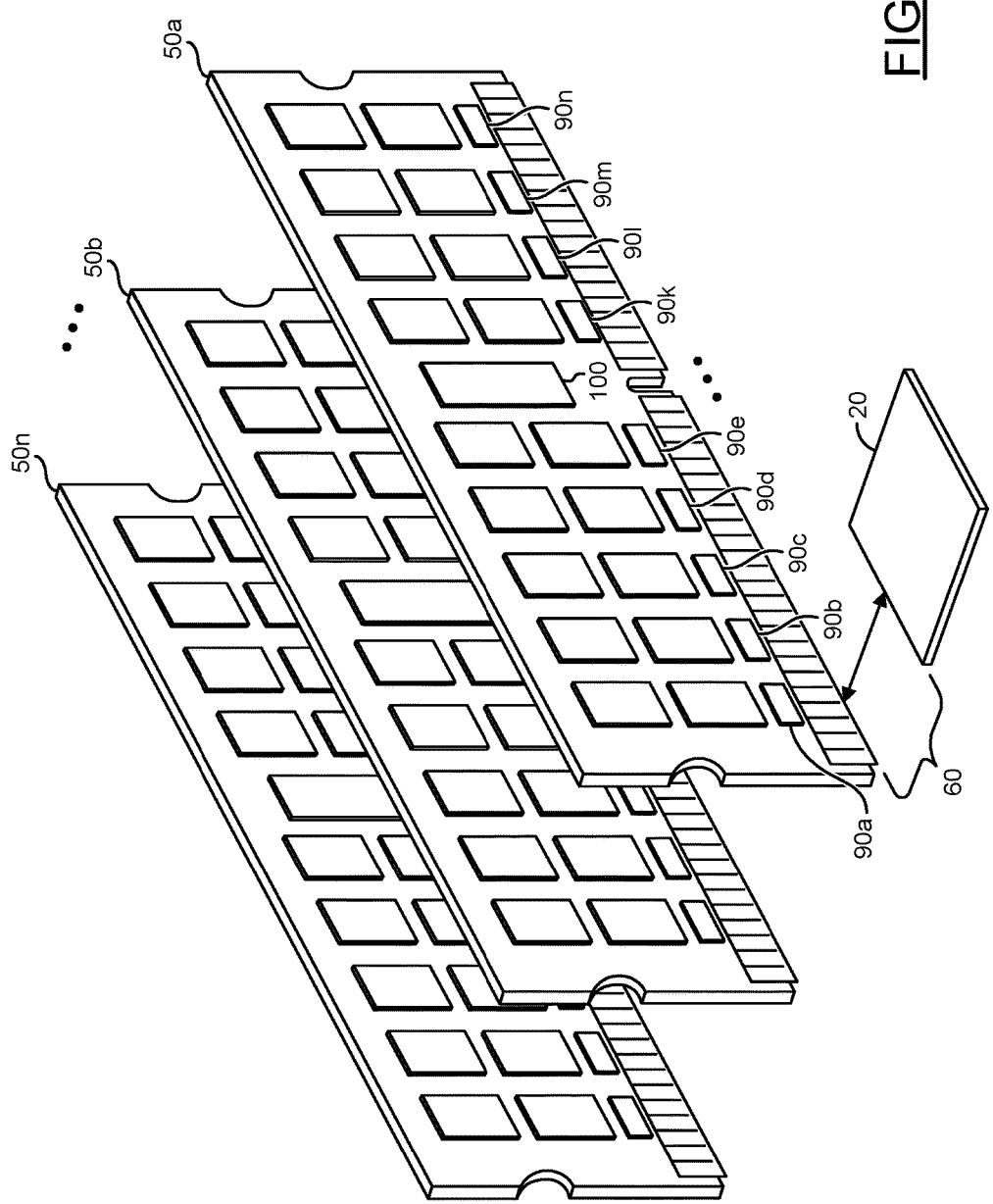
FIG. 1 is a diagram of a number of circuits.

Referring to FIG. 1, a diagram illustrating a number of example circuits 50a-50n is shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 100, and/or various other blocks, circuits, pins, connectors and/or traces. The circuits 90a-90n may be configured as data buffers. The circuit 100 may be implemented as a registered clock driver (RCD). In an example, the RCD circuit 100 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared with 128 GB per dual in-line memory module (DIMM) in DDR3). The DDR4 SDRAM memory modules 50a-50n may operate at voltages of 1.2-1.35 volts (V) with a frequency between 800-2133 megahertz (MHZ) (e.g., compared with 1.5-1.65V at frequencies between 400-1067 MHZ in DDR3). In some embodiments, the memory modules 50a-50n may be implemented as low voltage DDR4 and operate at 1.05V. For example, the DDR4 SDRAM memory modules 50a-50n may implement 35% power savings compared with DDR3 memory. The DDR4 SDRAM memory modules 50a-50n may transfer data at speeds of 2.13-4.26 giga-transfers per second (GT/s) and higher (e.g., compared with 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared with DDR4 RDIMM (e.g., 1333 MT/s for DDR4 LRDIMM compared with 1067 MT/s for DDR4 RDIMM at 384 GB capacity). For example, compared with DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
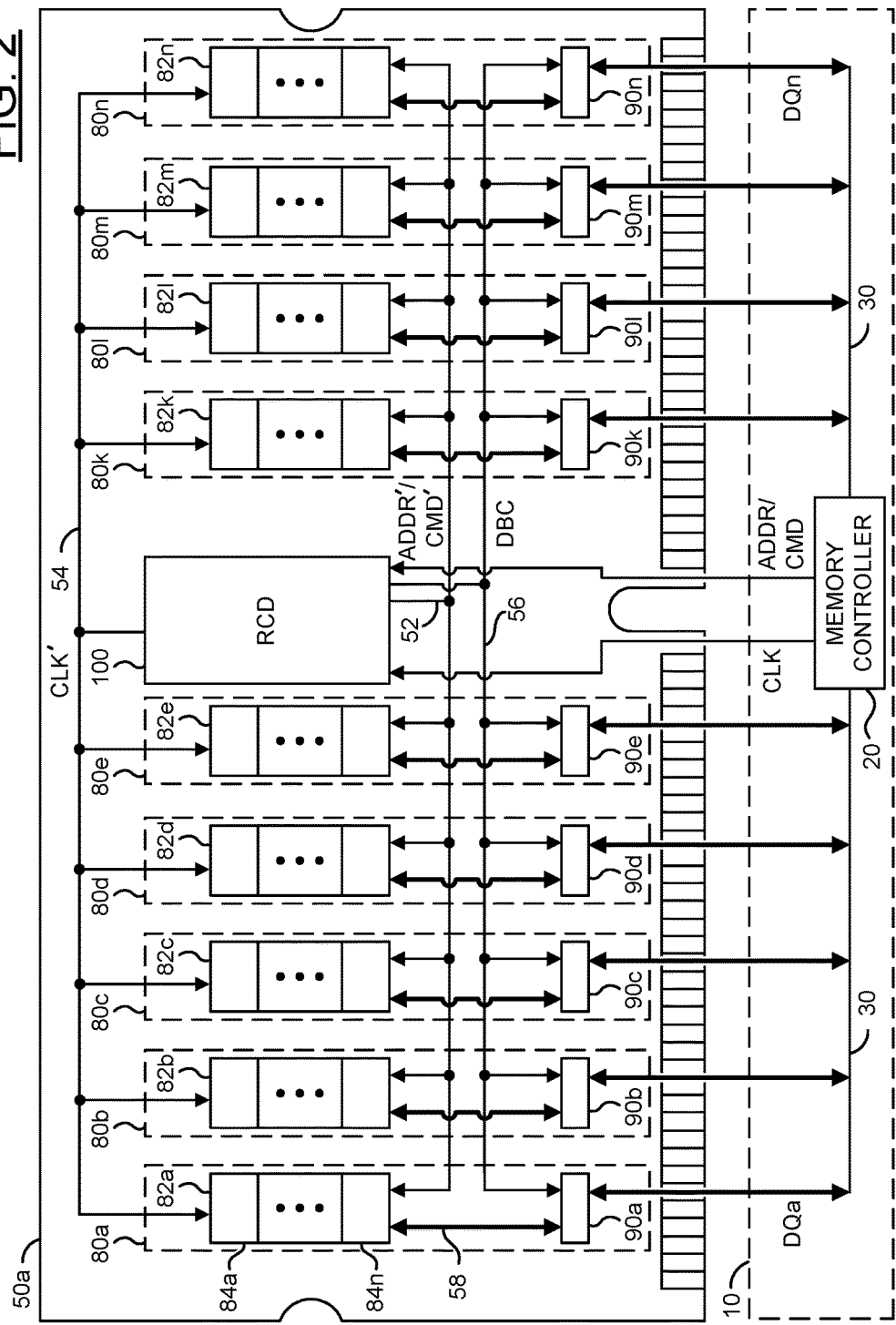
FIG. 2 is a block diagram illustrating a memory module.

Referring to FIG. 2, a block diagram illustrating a memory module 50a is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 100. The circuits 80a-80n may implement data paths of the memory module 50a. For example, the data path 80a may include the blocks 82a and/or the data buffer 90a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 100. A data bus 30 may be connected between the memory controller 20 and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 100 may be configured to communicate with the memory controller 20, the memory channels 82a-82n and/or the data buffers 90a-90n. The RCD circuit 100 may decode instructions received from the memory controller 20. For example, the RCD circuit 100 may receive register command words (RCWs). In another example, the RCD circuit 100 may receive buffer control words (BCWs). The RCD circuit 100 may be configured to train the DRAM chips 84a-84n, the data buffers 90a-90n and/or command and address lines between the memory controller 20. For example, the RCWs may flow from the memory controller 20 to the RCD circuit 100. The RCWs may be used to configure the RCD circuit 100.

The RCD circuit 100 may be used in both LRDIMM and RDIMM configurations. The RCD circuit 100 may implement a 32-bit 1:2 command/address register. The RCD circuit 100 may support an at-speed bus (e.g., a BCOM bus between the RCD circuit 100 and the data buffers 90a-90n). The RCD circuit 100 may implement automatic impedance calibration. The RCD circuit 100 may implement command/address parity checking. The RCD circuit 100 may control register RCW readback. The RCD circuit 100 may implement a 1 MHZ inter-integrated circuit (I2C) bus (e.g., a serial bus). Inputs to the RCD circuit 100 may be pseudo-differential using external and/or internal voltages. The clock outputs, command/address outputs, control outputs and/or data buffer control outputs of the RCD circuit 100 may be enabled in groups and independently driven with different strengths.

The RCD circuit 100 may receive the signal CLK and/or the signals ADDR/CMD from the memory controller 20. Various digital logic components of the RCD circuit 100 may be used to generate signals based on the signal CLK and/or the signals ADDR/CMD and/or other signals (e.g., RCWs). The RCD circuit 100 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 100 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84A-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared with DDR3 LRDIMM designs, that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared with the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
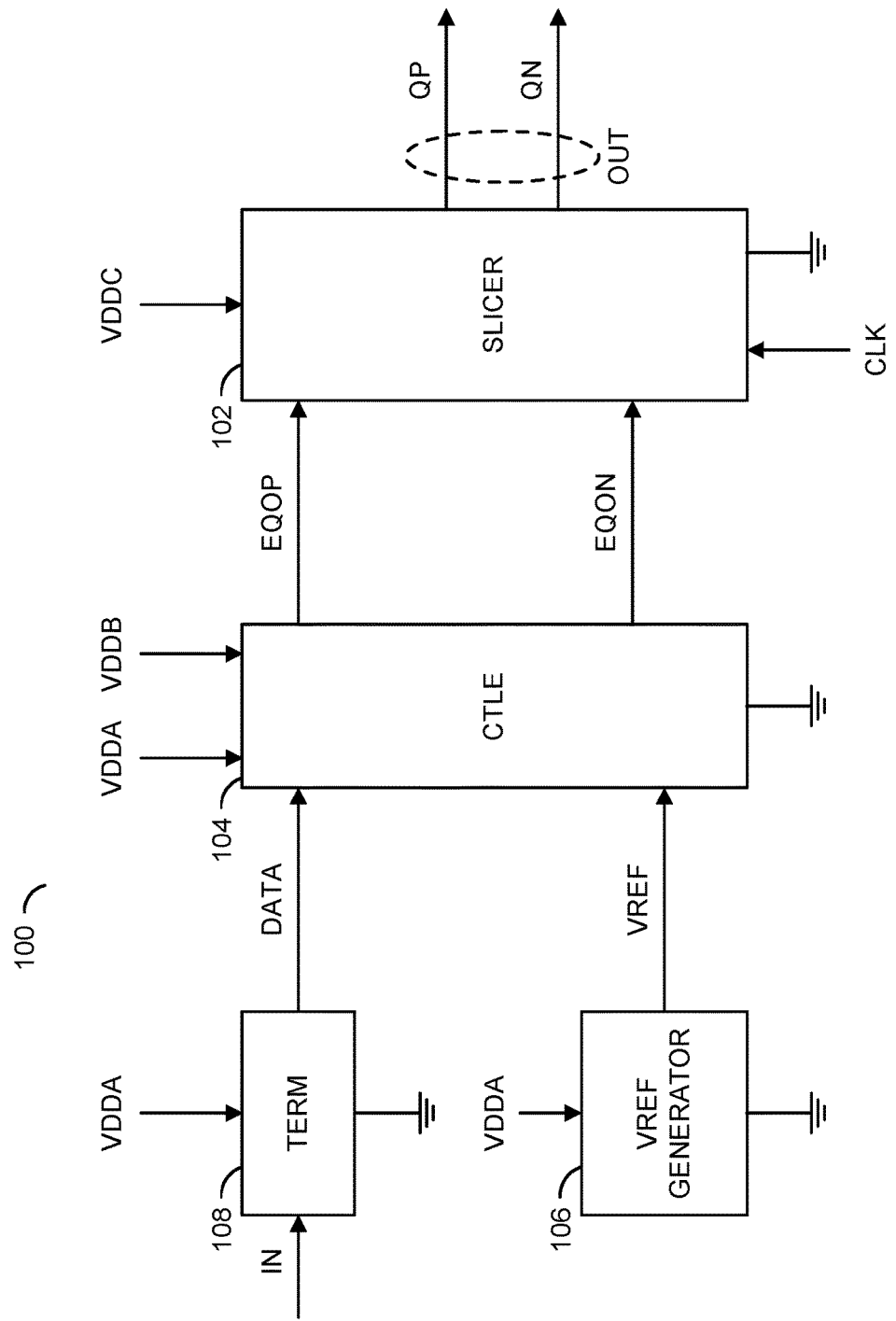
FIG. 3 is a block diagram of a receiver portion of a registered clock driver circuit in accordance with an embodiment of the invention.

Referring to FIG. 3, a block diagram of an example implementation of the receiver portion of the RCD circuit 100 is shown in accordance with an embodiment of the invention. The receiver portion generally comprises a slicer block (or circuit) 102, a CTLE block (or circuit) 104, a reference voltage generator block (or circuit) 106 and a line-termination block (or circuit) 108. The circuits 102 to 108 may be implemented as one or more integrated circuits.

The circuits 104, 106 and 108 may receive a power supply voltage (e.g., VDDA) that defines an input/output (or high) voltage domain (e.g., Vdda). The CTLE circuit 104 may receive another power supply voltage (e.g., VDDB) that defines an intermediate (or medium) voltage domain (e.g., Vddb). The slicer circuit 102 may receive still another power supply voltage (e.g., VDDC) that defines a core (or low) voltage domain (e.g., Vddc). The core power supply voltage VDDC may have a relatively fixed voltage. In various embodiments, all voltage domains Vdda, Vddb and Vddc may share a common ground. The input/output voltage domain Vdda may have a higher upper voltage than the intermediate voltage domain Vddb (e.g., Vdda>Vddb) relative to the common ground. The intermediate voltage domain Vddb generally has a higher upper voltage than the core voltage domain Vddc (e.g., Vddb>Vddc) relative to the common ground.

A signal (e.g., IN) may be received by the line-termination circuit 108. In various embodiments, the signal IN may represent any of the commands in the signal CMD, the addresses in the signal ADDR and/or other information transferred from the memory controller 20 to the RCD circuit 100. The signal IN may be a single-ended signal residing in the input/output voltage domain Vdda. A signal (e.g., DATA) may be generated by the line-termination circuit 108 and transferred to the CTLE circuit 104. The signal DATA may be a variation of the signal IN. The signal DATA may be generated in the input/output voltage domain Vdda. A signal (e.g., VREF) may be generated by the reference voltage generator circuit 106 and received by the CTLE circuit 104. The signal VREF may implement a reference voltage generated in the input/output voltage domain Vdda. A differential signal (e.g., EQOP and EQON) may be generated by the CTLE circuit 104 and received by the slicer circuit 102. The differential signal EQOP/EQON may implement an equalized version of the signal DATA. The differential signal EQOP/EQON may reside in the intermediate voltage domain Vddb. A differential signal (e.g., QP and QN) may be generated and presented by the slicer circuit 102. The differential signal QP/QN may implement a received data signal. The differential signal QP/QN may reside in the core voltage domain Vddc. A combination of the signal QP and the signal QN may be referred to as an output signal (e.g., OUT). The clock signal CLK may be received by the slicer circuit 102.

The slicer circuit 102 may be operational to convert differential signal EQOP/EQON into the signal OUT. The slicer circuit 102 may sample the differential signal EQOP/EQON on each positive edge (or each negative edge) of the signal CLK. The signal OUT may carry a shaped version of the information received in the differential signal EQOP/EQON. The shaping generally retains level portions of the information that represent nominal values of the information in intervals between consecutive transitions. The slicer circuit 102 may be implemented with core transistors (e.g., NMOS transistors) as input devices to achieve a small clock-to-data output (ck-q) delay. Voltage levels in the differential signals EQOP/EQON generated by the CTLE circuit 104 generally do not exceed a maximum operating voltage of the core transistors in the slicer circuit 102.

The CTLE circuit 104 may be configured to improve a data eye height and improve width shmoo results for the information in the signal DATA. Although the information in the signal DATA and the reference voltage signal VREF comes from the input/output input/output voltage domain Vdda, the CTLE circuit 104 is generally placed under the intermediate voltage domain Vddb. Input circuitry of the CTLE circuit 104 is generally designed to tolerate the potentially high voltage swings of the signal DATA. The CTLE circuit 104 may be implemented with the relatively smaller and relatively faster core transistors used in the core voltage domain Vddc. From a system perspective, a receiver data sample setup time may correspond mainly to the latency through the CTLE circuit 104. By using the relatively faster core transistors with higher current in the CTLE circuit 104, a data setup time (e.g., tSU) may be reduced and more balance achieved between a data high-to-low setup time (e.g., tSU_HL) and a data low-to-high setup time (e.g., tSU_LH). Due to timing criteria, relatively faster core transistors powered by the lower core voltage domain Vddc may be used in the slicer circuit 102. The CTLE circuit 104 is generally configured to create a suitable voltage swing in the differential signal EQOP/EQON for the slicer circuit 102.

The reference voltage generator circuit 106 may be operational to provide a fixed reference voltage in the signal VREF to multiple (e.g., up to 33) copies of the CTLE circuit 104. In some embodiments, the signal VREF may be generated as a fraction (e.g., half) of the input/output input/output voltage domain Vdda. The fraction may be achieved using a resistor divider network. Other reference voltages may be generated to meet the design criteria of a particular implementation. In various embodiments, multiple instantiations of the reference voltage generator circuit 106 may be implemented based on the number of CTLE circuits 104 that consume the signal VREF.

The line-termination circuit 108 may implement an input bus termination buffer for each input signal IN. The line-termination circuit 108 may be implemented as a resistor divider, with an effective impedance of several hundred (e.g., 200) ohms to the input/output power supply voltage VDDA and several hundred (e.g., 200 ohms) to ground (e.g., VSS) for termination of the signal IN. The line-termination circuit 108 may use relatively slower input/output transistors for the input/output voltage domain Vdda compared with the core transistors used in the intermediate voltage domain Vddb and the core voltage domain Vddc.

The core devices (e.g., transistors) may be used in the slicer circuit 102 to achieve timing benefits without an over-voltage reliability risk. In the structure illustrated, the CTLE output common mode voltage of the differential signal EQOP/EQON generally follows the intermediate power supply voltage VDDB powering the CTLE circuit 104. As such, CTLE output common mode voltage may not be sensitive to variations in the input/output power supply voltage VDDA no matter how wide an operation range of the input/output power supply voltage VDDA covers.

Figure 4:
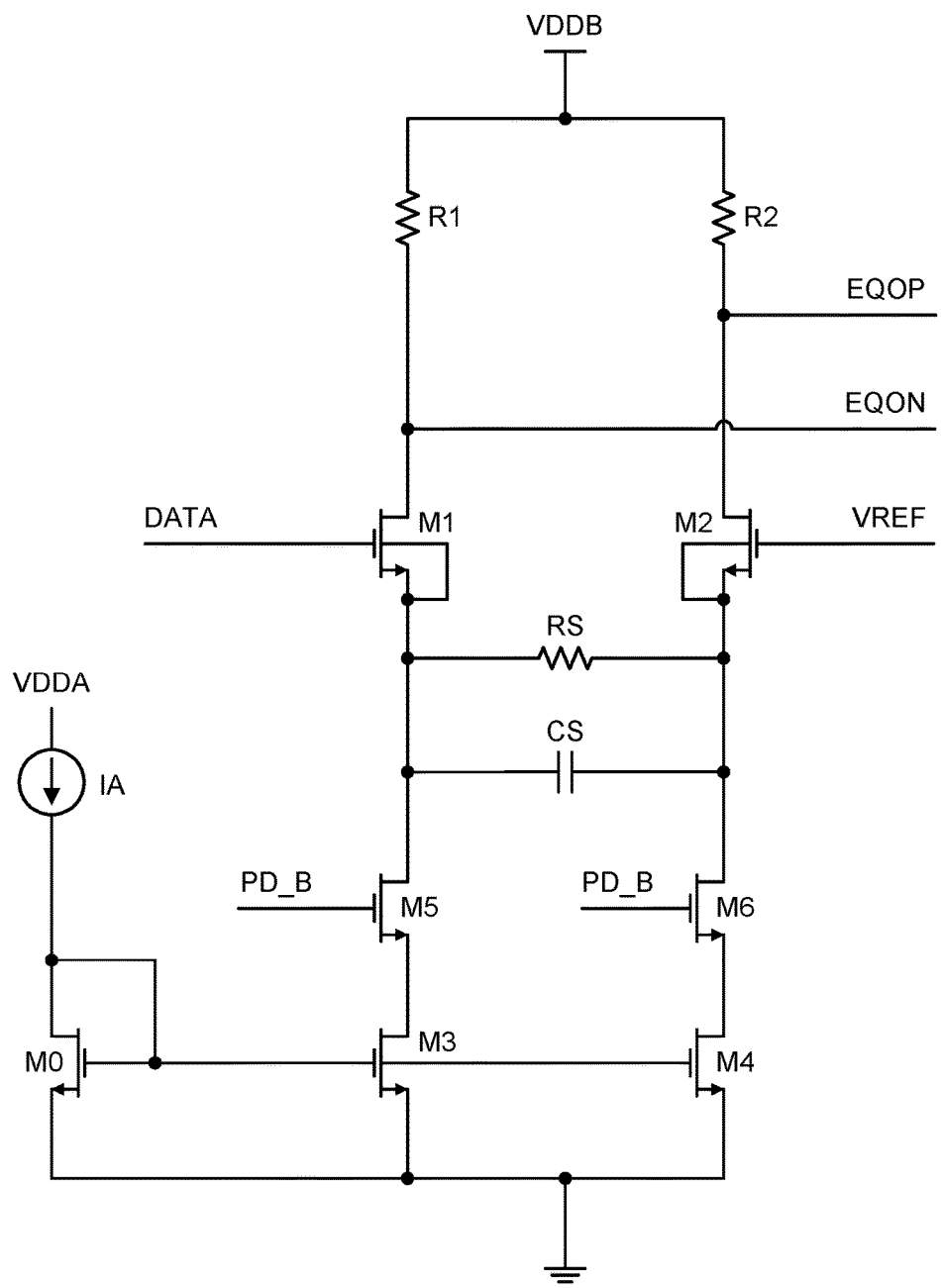
FIG. 4 is a schematic diagram of a continuous-time linear equalizer circuit.

Referring to FIG. 4, a schematic diagram of an example implementation of the CTLE circuit 104 is shown. The CTLE circuit 104 generally comprises multiple transistors M0 to M6, multiple resistors R1, R2 and RS, a capacitor CS, and a current source IA.

The signal DATA may be received at a gate node of the transistors M1. The signal VREF may be received at a gate node of the transistor M2. A power down (or power control) signal (e.g., PD_B) may be received at the gate nodes of the transistors M5 and M6 from logic within the RCD circuit 100. The load resistors R1 and R2 may receive the intermediate power supply voltage VDDB. The current source IA may receive the input/output power supply voltage VDDA.

The transistors M1 and M2 are generally arranged as an amplifier having parallel paths (or sides). Load resistors R1 and R2 may be connected to the intermediate power supply voltage VDDB to the transistors M1 and M2, respectively. The capacitor CS and the resistor RS may be connected in parallel between source nodes of the transistors M1 and M2 to set a filter frequency characteristic of the CTLE circuit 104. In various embodiments, the filter characteristic may cause the CTLE circuit 104 to function as a negative impedance converter.

The transistors M5 and M6 may be connected in series with the transistors M1 and M2 in the rejective sides of the amplifier. The power down signal PD_B may be used to switch on and switch off the amplifier. While the power down signal PD_B is active (e.g., a high voltage or a logical one state), the transistors M5 and M6 may be conductive, the amplifier may be switched on, and the differential signal EQOP/EQON may be responsive to the signal DATA relative to the reference voltage signal VREF. While the power down signal PD_B is inactive (e.g., a low voltage or a logical zero state), the transistors M5 and M6 may be non-conductive, the amplifier may be switched off, and the individual signals EQOP and EQON may be pulled to the intermediate power supply voltage VDDB by the load resistors R1 and R2.

The transistors M3 and M4 may be connected in series with the transistors M5 and M6 in the respective sides of the amplifier. The transistors M3 and M4 may be operational as current sources. Biasing of the gate nodes of the transistors M3 and M4 may be controlled by the current source IA and the transistor M0. The current generated by the current source IA may not be sensitive to power source fluctuations and so uses the input/output power supply voltage VDDA.

In an example, the conditioning performed by the CTLE circuit 104 may boost high frequency components of the differential signal EQOP/EQON relative to lower frequency components. A particular amount of crosstalk (e.g., noise) between the signal EQOP and the signal EQON may present a practical limit the amount of boosting that may be applied. The CTLE circuit 104 may increase an amount of the amplitude of the differential signal EQOP/EQON. The amplitude may be increased without an increase in an amount of crosstalk and/or reflections (e.g., noise).

From the system perspective, the latency of the CTLE circuit 104 may be regarded as the data setup time tSU ahead of a toggling of the signal CLK. Common CTLE design generally show that the setup time of the data high-to-low transition tSU_HL may be much larger than the setup time of the data low-to-high transition tSU_LH, especially with large input voltage swing.

When the signal DATA transitions from a high voltage to a low voltage, the corresponding input transistor M1 should be switched off (e.g., non-conducting), and the opposite input transistor M2 should be switched on (e.g., conducting) in a short amount of time. However, the reference voltage signal VREF may be fixed at 0.5×VDDA volts as a default. Therefore, the source node voltage of the transistor M2 may take time to settle lower than (0.5×VDDA)−Vth volts and the transistor M2 is fully switched on, where Vth is a threshold voltage of the transistors. Since the settling time is generally limited by the input transistor threshold voltages, the input transistor pair M1 and M2 may be implemented using the relatively fast core transistors and the tail current flowing through the transistor pair M3 and M4 may be a relatively large current. As such, the input transistor gate-to-source voltages may increase and so improve the tSU_HL/tSU_LH balance. Furthermore, a size of the core transistors may be smaller than a size of the input/output transistors resulting in less parasitic capacitance and a shorter setup time tSU.

Since the signal DATA may reside in the input/output voltage domain Vdda, the core should be protected from an over voltage risk. Each core transistor in the input transistor pair M1 and M2 may have a device bulk node connected to the corresponding source node. The power down transistors M5 and M6 may be inserted between input transistors M1 and M2 and the tail current transistors M3 and M4. As such, all of the core transistors may be protected without over voltage risk regardless if the CTLE circuit 104 is switched on or switched off.

Figure 5:
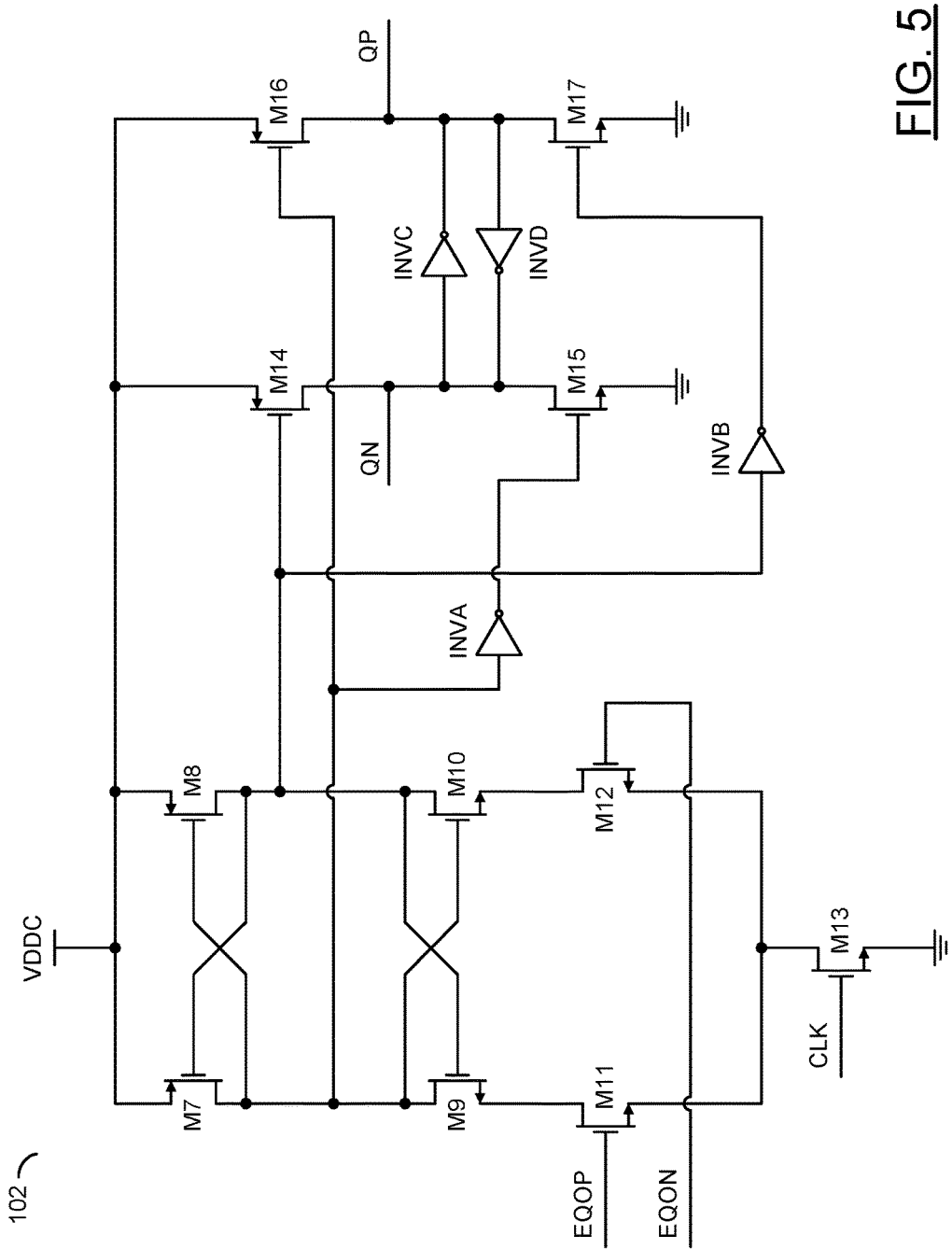
FIG. 5 is a schematic diagram of a slicer circuit.

Referring to FIG. 5, a schematic diagram of an example implementation of the slicer circuit 102 is shown. The slicer circuit 102 generally comprises multiple transistors M7 to M17 and multiple inverter gates (or circuits) INVA to INVD.

The slicer circuit 102 generally receives the differential signal EQOP/EQON from the CTLE circuit 104. The signal OUT may be generated by the slicer circuit 102 as the differential signal QP/QN.

In various embodiments, the transistors M9, M10, M11, M13, M15 and M17 may be implemented as NMOS transistors. The transistors M7, M8, M14 and M16 may be implemented as PMOS transistors. Other transistor types may be implemented to meet the design criteria of a particular application. Two of the inverter circuits (INVA and INVB) may invert signals generated at the drain nodes of the transistors M9 and M10 to present signals to the gate nodes of the transistors M5 and M17, respectively. Two other inverter circuits (INVC and INVD) may be arranged as a latch.

The transistors M7 to M12 may be arranged as a differential amplifier. The signal EQOP may be received at the gate node of the transistor M11. The signal EQON may be received at the gate node of the transistor M12.

The source nodes of the transistors M11 and M12 may be connected to the drain node of the transistor M13. The gate node of the transistor M13 may receive the signal CLK. The source node of the transistor M13 may be connected to a signal ground.

The gate nodes of the transistors M9 and M10 may be cross-coupled to the opposite source nodes. The gate nodes of the transistors M7 and M8 may be cross-coupled to the opposite source nodes. The drains of the transistors M9 and M1 may be connected to the respective source nodes of the transistors M7 and M8. The drains of the transistors M7 and M8 may be connected to the core power supply voltage VDDC.

The gate node of the transistor M14 may be connected to the drain node of the transistor M10. The gate node of the transistor M15 may be connected to an output node of the inverter circuit INVA. An input node of the inverter circuit INVA may be connected to the drain node of the transistors M9. The transistors M14 and M15 may be configured to pull up and pull down, respectively, an end of the latch that generates the signal QN. The gate node of the transistor M16 may be connected to the drain node of the transistor M9. The gate node of the transistor M17 may be connected to the output node of the inverter circuit INVB. An input node of the inverter circuit INVB may be connected to the drain node of the transistors M10. The transistors M16 and M17 may be configured to pull up and pull down, respectively, the other end of the latch that generates the signal QP.

Figure 6:
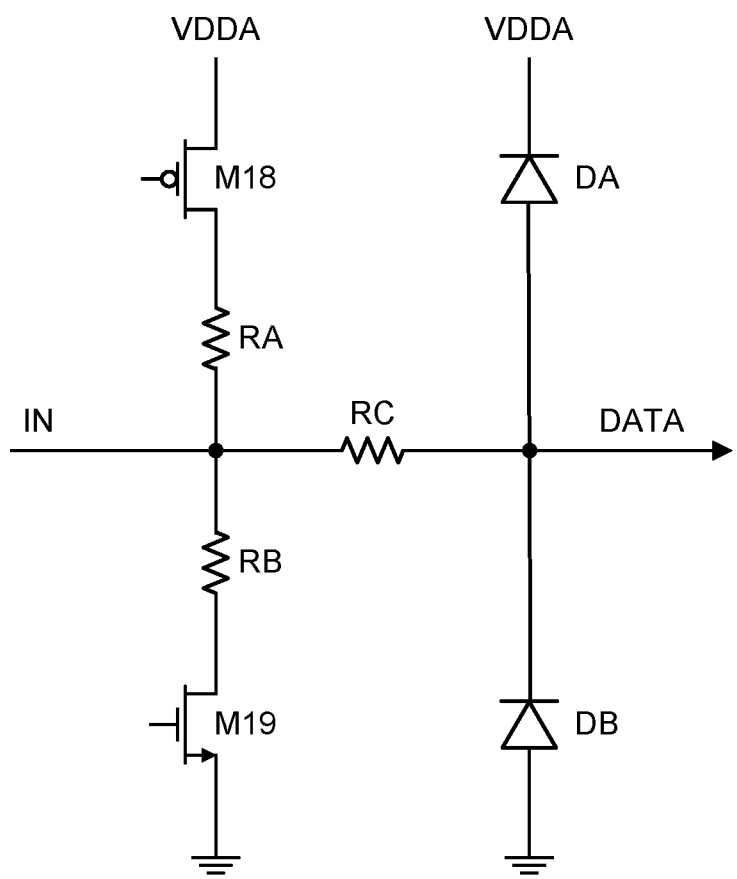
FIG. 6 is a schematic diagram of a line-termination circuit.

Referring to FIG. 6, a schematic diagram of an example implementation of the line-termination circuit 108 is shown. The line-termination circuit 108 generally comprises multiple resistors RA to RC, multiple diodes DA and DB and multiple transistors M18 and M19.

The resistor RA and the transistor M18 may be connected in series between the input/output power supply voltage VDDA and a central node. The resistor RB and the transistor M19 may be connected in series between ground and the central node. The resistor RA and the transistor M18 may provide an effective impedance of several hundred (e.g., 200) ohms to the input/output power supply voltage VDDA.

The resistor RB and the transistor M19 may provide several hundred (e.g., 200 ohms) to ground for termination of the signal IN.

The resistor RC and the diodes DA and DB may be configured as a clamping circuit for the signal DATA. The diode DA may prevent the voltage of the signal DATA from exceeding the high rail of the input/output power supply voltage VDDA by a diode threshold voltage. The diode DB may prevent the voltage of the signal DATA from falling below the signal ground by more than the diode threshold voltage.

Embodiments of the invention have shown improved performance when implemented in prototype silicon devices. Tests using automatic test equipment generally show no malfunctions until the input/output power supply voltage VDDA is large (e.g., >2 volts) compared with malfunctions at 1.6 volts for common devices. A difference in the setup time high to low and the setup time low to high in the invention is generally smaller and more balanced compared with the common designs.

While FIG. 3 shows the CTLE circuit 104 in the context of the RCD circuit 100 while receiving information, copies of the CTLE circuit 104 may be implemented at other locations, other data paths and/or other control paths. In some embodiments, copies of the CTLE circuits 104 may be located in the data buffer circuits 90*a*-90*n* to improve the signals received from the memory controller 20 during write cycles. In various embodiments, copies of the CTLE circuits 104 may be located at the other end of the data bus 30 to improve various signals generated by the memory modules 50*a*-50*n* and received by the memory controller 20. For example, the memory controller 20 may include copies of the CTLE circuits 104 to equalize the read data sent in the signals DQa-DQn from the memory modules 50*a*-50*n* during a read cycle. Instances of the CTLE circuits 104 may also be implemented in other circuitry within the memory modules 50*a*-50*n*.

Although embodiments of the invention have been described in the context of a DDR4 application, the invention is not limited to DDR4 applications, but may also be applied in other high data rate digital communication applications where different transmission line effects, cross-coupling effects, traveling wave distortions, phase changes, impedance mismatches and/or line imbalances may exist. The invention addresses concerns related to high speed communications, flexible clocking structures, specified command sets and lossy transmission lines. Future generations of DDR can be expected to provide increasing speed, more flexibility, additional commands and different propagation characteristics. The invention may also be applicable to memory systems implemented in compliance with either existing (legacy) memory specifications or future memory specifications.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a line-termination circuit configured to generate a data signal in response to an input signal, wherein (i) said input signal resides in a first voltage domain, (ii) said input signal is single-ended and (iii) said data signal is generated in said first voltage domain; and
   a continuous-time linear equalizer circuit configured to generate an intermediate signal by equalizing said data signal relative to a reference voltage, wherein (i) said continuous-time linear equalizer circuit operates in a second voltage domain and (ii) said first voltage domain is higher than said second voltage domain.

2. The apparatus according to claim 1, wherein said apparatus comprises a double data rate memory module.

3. The apparatus according to claim 2, wherein said double data rate memory module comprises a double data rate fourth generation dual in-line memory module.

4. The apparatus according to claim 1, further comprising a slicer circuit configured to generate an output signal by slicing said intermediate signal, wherein (i) said output signal is generated in a third voltage domain and (ii) said second voltage domain is higher than said third voltage domain.

5. The apparatus according to claim 1, further comprising a reference voltage circuit configured to generate said reference voltage in said first voltage domain.

6. The apparatus according to claim 1, wherein (i) said line-termination circuit comprises a plurality of first transistors of a first type and (ii) said continuous-time linear equalizer circuit comprises a plurality of second transistors of a second type and (iii) said first type of said first transistors are slower than said second type of said second transistors.

7. The apparatus according to claim 1, wherein said continuous-time linear equalizer circuit is configured to maintain said intermediate signal within said second voltage domain while a common mode voltage between said data signal and said reference voltage exceeds said second voltage domain.

8. The apparatus according to claim 1, wherein (i) said continuous-time linear equalizer circuit comprises a first transistor having a first gate that receives said data signal and a second transistor having a second gate that receives said reference voltage and (ii) each of said first transistor and said second transistor has a bulk node directly connected to a corresponding source node.

9. The apparatus according to claim 1, wherein (i) said continuous-time linear equalizer circuit comprises a differential amplifier and (ii) each side of said differential amplifier includes a transistor configured to switch said side on and off.

10. The apparatus according to claim 1, wherein said apparatus implements a registered clock driver circuit.

11. A method for high signal voltage tolerance in a single-ended memory interface, comprising the steps of:
    generating a data signal in response to an input signal using a line-termination circuit, wherein (i) said input signal resides in a first voltage domain, (ii) said input signal is single-ended and (iii) said data signal is generated in said first voltage domain; and
    generating an intermediate signal by equalizing said data signal relative to a reference voltage in a continuous-time linear equalizer circuit, wherein (i) said continuous-time linear equalizer circuit operates in a second voltage domain and (ii) said first voltage domain is higher than said second voltage domain.

12. The method according to claim 11, wherein the steps are performed in a double data rate memory module.

13. The method according to claim 12, wherein said double data rate memory module comprises a double data rate fourth generation dual in-line memory module.

14. The method according to claim 11, further comprising the step of:
    generating an output signal by slicing said intermediate signal, wherein (i) said output signal is generated in a third voltage domain and (ii) said second voltage domain is higher than said third voltage domain.

15. The method according to claim 11, further comprising the step of:
    generating said reference voltage in said first voltage domain.

16. The method according to claim 11, wherein (i) said line-termination circuit comprises a plurality of first transistors of a first type and (ii) said continuous-time linear equalizer circuit comprises a plurality of second transistors of a second type and (iii) said first type of said first transistors are slower than said second type of said second transistors.

17. The method according to claim 11, wherein said continuous-time linear equalizer circuit is configured to maintain said intermediate signal within said second voltage domain while a common mode voltage between said data signal and said reference voltage exceeds said second voltage domain.

18. The method according to claim 11, further comprising the steps of:
    receiving said data signal at a first gate of a first transistor of said continuous-time linear equalizer circuit; and
    receiving said reference voltage at a second gate of a second transistors of said continuous-time linear equalizer circuit, wherein each of said first transistor and said second transistor has a bulk node directly connected to a corresponding source node.

19. The method according to claim 11, wherein (i) said continuous-time linear equalizer circuit comprises a differential amplifier and (ii) each side of said differential amplifier includes a transistor configured to switch said side on and off.

20. The method according to claim 11, wherein the steps are performed in a registered clock driver circuit.

\* \* \* \* \*